(12) United States Patent
Kim

(10) Patent No.: US 9,653,217 B2
(45) Date of Patent: May 16, 2017

(54) METHOD OF MANUFACTURING SURFACE-TREATED TRANSPARENT CONDUCTIVE POLYMER THIN FILM, AND TRANSPARENT ELECTRODE MANUFACTURED USING THE SAME

(71) Applicant: LG CHEM, LTD., Seoul (KR)

(72) Inventor: Mikyoung Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 36 days.

(21) Appl. No.: 14/650,812

(22) PCT Filed: Oct. 18, 2014

(86) PCT No.: PCT/IB2014/065437
§ 371 (c)(1),
(2) Date: Jun. 9, 2015

(87) PCT Pub. No.: WO2015/071794
PCT Pub. Date: May 21, 2015

(65) Prior Publication Data
US 2016/0268056 A1    Sep. 15, 2016

(30) Foreign Application Priority Data

Oct. 10, 2013 (KR) .................. 10-2013-0120596

(51) Int. Cl.
*B05D 3/10* (2006.01)
*H01G 9/20* (2006.01)
(Continued)

(52) U.S. Cl.
CPC ......... *H01G 9/2059* (2013.01); *C09D 11/106* (2013.01); *C09D 11/30* (2013.01);
(Continued)

(58) Field of Classification Search
CPC .... H01G 9/2059; H01G 9/2022; C09D 11/52; C09D 165/00
(Continued)

(56) References Cited

U.S. PATENT DOCUMENTS

2007/0200099 A1    8/2007  Lee et al.
2012/0032104 A1    2/2012  Amb et al.
(Continued)

FOREIGN PATENT DOCUMENTS

JP    2010533219 A    10/2010
JP    2012004092 A    1/2012
(Continued)

OTHER PUBLICATIONS

Mukherjee et al. "Solution-Processed Poly(3,4-ethylenedioxythiophene) Thin Films as Transparent Conductors: Effect of p-Toluenesulfonic Acid in Dimethyl Sulfoxide" ACS Appl. Mater. Interfaces, 2014, 6 (20) pp. 17792-17803, publication date: Sep. 17, 2014.*

*Primary Examiner* — Robert S Walters, Jr.
(74) *Attorney, Agent, or Firm* — Dentons US LLP

(57) ABSTRACT

Disclosed is a method of manufacturing a surface-treated transparent conductive polymer thin film, including: 1) preparing a PEDOT:PSS ink composition; 2) forming a PEDOT:PSS thin film on a substrate using the ink composition; 3) applying a p-toluene sulfonic acid solution on the PEDOT:PSS thin film and then thermally treating the PEDOT:PSS thin film; 4) rinsing the thermally treated PEDOT:PSS thin film; and 5) drying the rinsed PEDOT:PSS thin film.

13 Claims, 1 Drawing Sheet

(51) Int. Cl.
*C09D 11/52* (2014.01)
*H01L 31/18* (2006.01)
*C09D 11/106* (2014.01)
*C09D 11/30* (2014.01)
*C09D 165/00* (2006.01)
*H01L 51/00* (2006.01)
*H01B 1/12* (2006.01)
*H01L 51/44* (2006.01)

(52) U.S. Cl.
CPC ............ *C09D 11/52* (2013.01); *C09D 165/00* (2013.01); *H01B 1/127* (2013.01); *H01G 9/2022* (2013.01); *H01L 31/1884* (2013.01); *H01L 51/0037* (2013.01); *C08G 2261/1424* (2013.01); *C08G 2261/3223* (2013.01); *C08G 2261/794* (2013.01); *H01L 51/441* (2013.01); *Y02E 10/50* (2013.01)

(58) Field of Classification Search
USPC ........................................................ 427/337
See application file for complete search history.

(56) References Cited

U.S. PATENT DOCUMENTS

| | | | |
|---|---|---|---|
| 2012/0147528 A1 | 6/2012 | Biler et al. | |
| 2014/0000700 A1* | 1/2014 | Kim | ............ H01L 51/441 |
| | | | 136/256 |

FOREIGN PATENT DOCUMENTS

| | | |
|---|---|---|
| KR | 1020080010425 A | 1/2008 |
| KR | 1020090084777 A | 8/2009 |
| KR | 1020100047440 A | 5/2010 |
| KR | 1020120011479 A | 2/2012 |
| KR | 1020120077112 A | 7/2012 |
| KR | 1020120086209 A | 8/2012 |
| KR | 1020120113701 A | 10/2012 |
| KR | 20130029247 | 3/2013 |
| KR | 1020130027213 A | 3/2013 |
| TW | 201217426 A1 | 5/2012 |

\* cited by examiner

METHOD OF MANUFACTURING SURFACE-TREATED TRANSPARENT CONDUCTIVE POLYMER THIN FILM, AND TRANSPARENT ELECTRODE MANUFACTURED USING THE SAME

This application is a National Stage Application of International Application No. PCT/IB2014/065437, filed Oct. 18, 2014, and claims the benefit of Korean Application No. 10-2013-0120596, filed Oct. 10, 2013, all of which are hereby incorporated by reference in their entirety for all purposes as if fully set forth herein.

BACKGROUND OF THE INVENTION

1. Technical Field

The present invention relates to a method of manufacturing a transparent conductive polymer thin film having high conductivity via surface treatment, and to a transparent electrode manufactured using the same.

2. Description of the Related Art

Poly(3,4-ethylenedioxythiophene)-poly(styrenesulfonate) (PEDOT:PSS) may be mainly provided in the form of an aqueous dispersion to form a polymer thin film, and the conductivity of PEDOT:PSS is as low as 0.1~1 S/cm. Hence, the conductivity of PEDOT:PSS may be increased by adding the PEDOT:PSS solution with a dimethyl sulfoxide (DMSO) or dimethylformamide (DMF) solution or with a polyhydric alcohol such as ethyleneglycol as a secondary dopant.

However, the addition of such a material may deteriorate stability upon long-term storage of the PEDOT:PSS aqueous dispersion. Also, when glass or a film is coated therewith, surface tension of the solution may increase, and thus wettability on the substrate may become poor, making it difficult to form a uniform film.

With the goal of solving such problems, attempts have been made to subject a polymer thin film formed of the PEDOT:PSS aqueous dispersion to surface treatment so as to increase conductivity.

Specifically, the PEDOT:PSS film is surface-treated using sulfuric acid, hexafluoroacetone, methanol or DMF. Particularly, the use of sulfuric acid may result in great improvements in conductivity. However, sulfuric acid causes severe loss of the PEDOT:PSS film. Furthermore, safety problems of workers may occur due to the use of the strong acid.

SUMMARY OF THE INVENTION

Accordingly, the present invention has been made keeping in mind the problems encountered in the related art, and an object of the present invention is to provide a method of manufacturing a transparent conductive polymer thin film having conductivity as high as when using sulfuric acid, by virtue of a surface treatment process that may be easily handled.

Another object of the present invention is to provide a transparent electrode having high conductivity by use of the transparent conductive polymer thin film.

In order to accomplish the above objects, the present invention provides a method of manufacturing a surface-treated transparent conductive polymer thin film, including: 1) preparing a PEDOT:PSS ink composition; 2) forming a PEDOT:PSS thin film on a substrate using the ink composition; 3) coating the PEDOT:PSS thin film with a p-toluene sulfonic acid solution and then thermally treating the PEDOT:PSS thin film to give thermally treated PEDOT:PSS thin film; 4) rinsing the thermally treated PEDOT:PSS thin film to give rinsed PEDOT:PSS thin film; and 5) drying the rinsed PEDOT:PSS thin film.

According to the present invention, since a PEDOT:PSS aqueous dispersion can be formed into a thin film without the addition of another material, it is possible to form a uniform thin film and a transparent conductive ink film having high conductivity.

According to the present invention, a transparent conductive polymer thin film has high conductivity, and thus can be used instead of an ITO electrode and can be utilized as a buffer layer (a hole transport layer) or an electrode layer for an organic solar cell.

DESCRIPTION OF THE SPECIFIC EMBODIMENTS

Figure 1:
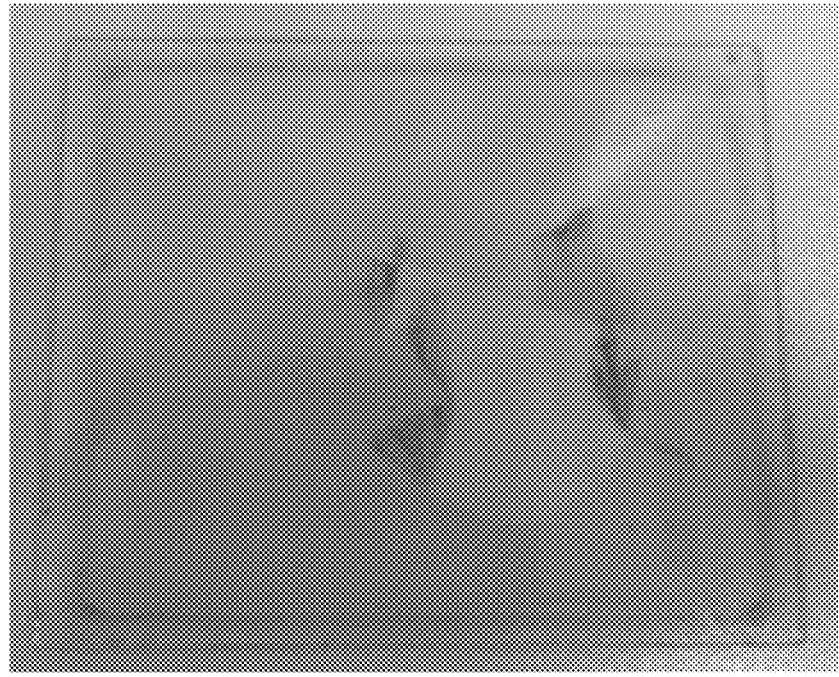
FIG. 1 is an electron microscope image illustrating a PEDOT:PSS thin film manufactured in Comparative Example 2.

Hereinafter, a detailed description will be given of the present invention.

The present invention addresses a method of manufacturing a surface-treated transparent conductive polymer thin film, including: 1) preparing a PEDOT:PSS ink composition; 2) forming a PEDOT:PSS thin film on a substrate using the ink composition; 3) applying a p-toluene sulfonic acid solution on the PEDOT:PSS thin film and thermally treating the PEDOT:PSS thin film to give thermally treated PEDOT:PSS thin film; 4) rinsing the thermally treated PEDOT:PSS thin film to give rinsed PEDOT:PSS thin film; and 5) drying the rinsed PEDOT:PSS thin film.

The PEDOT:PSS ink composition may include a PEDOT:PSS aqueous dispersion, a solvent and a surfactant.

The PEDOT:PSS aqueous dispersion imparts the ink composition with conductivity.

The amount of the PEDOT:PSS aqueous dispersion may be 10~70 wt % based on the total weight of the ink composition. If the amount thereof is less than 10 wt %, it is difficult to ensure sufficient conductivity due to too low of an amount of PEDOT:PSS. In contrast, if the amount thereof exceeds 70 wt %, spreadability may become poor, thus making it difficult to form a uniform thin film and deteriorating jetting properties upon ink jetting.

In a preferred embodiment of the present invention, the PEDOT:PSS aqueous dispersion includes, for example, PH-1000 available from Heraeus.

Since the PEDOT:PSS aqueous dispersion having high viscosity is not jetted alone, it is formulated in the form of an ink composition including a solvent and a surfactant so as to be jetted.

The solvent may include deionized water (DI water); diethyleneglycol butylether or diethyleneglycol ethylether; and propyleneglycol.

The deionized water functions to disperse the PEDOT:PSS aqueous dispersion, and the amount thereof may be 40~80 wt % based on the total weight of the solvent, and may be 10~40 wt % based on the total weight of the ink composition. If the amount of deionized water exceeds 40 wt % based on the total weight of the ink composition, the resulting ink has high surface tension and thus may not be spread on the substrate and is difficult to jet. In contrast, if the amount thereof is less than 10 wt %, the resulting ink is not suitable for use in ink-jetting due to high viscosity.

The diethyleneglycol butylether or diethyleneglycol ethylether functions to decrease volatility of ink and to enhance jetting capability.

The amount of diethyleneglycol butylether or diethyleneglycol ethylether may be 5~40 wt % based on the total weight of the solvent, and may be 2~15 wt % based on the total weight of the ink composition. If the amount of diethyleneglycol butylether or diethyleneglycol ethylether exceeds 40 wt % based on the total weight of the solvent, the resulting ink may have lowered conductivity. In contrast, if the amount thereof is less than 5 wt %, spreadability and jetting properties may become poor.

The propyleneglycol plays a role in maintaining dispersibility and conductivity of the ink composition. The amount thereof may be 5~40 wt % based on the total weight of the solvent, and may be 5~20 wt % based on the total weight of the ink composition. If the amount thereof falls out of the above range, the conductivity of the ink may decrease.

The surfactant is contained to enhance spreadability of the ink composition, and the amount thereof is 0.01~5 wt % based on the total weight of the ink composition. If the amount thereof is less than 0.01 wt %, spreadability cannot be obtained as desired. In contrast, if the amount thereof exceeds 5 wt %, the conductivity of the ink may decrease.

The surfactant may include a nonionic surfactant, especially a fluorine-based surfactant.

In another embodiment, the PEDOT:PSS ink composition may further include DMSO or DMF.

As such, DMSO or DMF may be added to increase the conductivity of the ink composition, and the amount thereof may be 1~5 wt % based on the total weight of the ink composition. If the amount thereof is less than 1 wt %, there is no improvement in conductivity. In contrast, if the amount thereof exceeds 5 wt %, the conductivity of the ink may decrease and poor stability may result.

In a further embodiment, the PEDOT:PSS ink composition may further include DMSO or DMF, and a polyhydric alcohol compound.

The polyhydric alcohol compound may include, but is not necessarily limited to, glycerol, diethyleneglycol, ethyleneglycol, and sorbitol.

The polyhydric alcohol compound is added to increase conductivity of the ink composition. The amount thereof may be 0.5~8 wt % based on the total weight of the ink composition. If the amount thereof exceeds 8 wt %, conductivity may decrease. In contrast, if the amount thereof is less than 0.5 wt %, there is no improvement in conductivity.

Since the ink composition thus formed exhibits superior jetting properties, it may be patterned using an inkjet printing process and is thus appropriate for use in inkjet printing.

In the present invention, 2) forming a PEDOT:PSS thin film on the substrate using the ink composition as above is carried out.

The PEDOT:PSS thin film is typically formed using bar coating, spin coating, inkjet printing, or spray coating. Particularly useful is inkjet printing because direct patterning may be implemented at a desired position using a small amount of material.

The substrate may include glass, a film or the like, but is not particularly limited thereto.

The material for the film substrate is not particularly limited, and may include, for example, PET, PC/PMMA, or polyimide.

Step 3) is a process of applying a p-toluene sulfonic acid solution on the PEDOT:PSS thin film and then thermally treating the PEDOT:PSS thin film.

The p-toluene sulfonic acid solution may be an aqueous solution, or a solution using methanol or ethanol as a solvent.

In the present invention, p-toluene sulfonic acid (PTSA) is used for surface treatment of the PEDOT:PSS thin film. Since PTSA is solid, it is easily handled compared to sulfuric acid and functions to impart conductivity as high as when using sulfuric acid. Furthermore, since PTSA is easily rinsed by methanol, a clean thin film having no surface stains may be formed. In the case where water stains are formed on the surface of the thin film, the haze of the film may undesirably increase.

The concentration of the p-toluene sulfonic acid solution may be 0.01~0.2 M. If the concentration thereof exceeds the upper limit, conductivity is not further increased.

The p-toluene sulfonic acid solution may be applied on the PEDOT:PSS thin film using a typical coating process. For example, paint brushing, spray coating, doctor blading, dip-drawing, spin coating, inkjet printing, or slot die coating may be useful.

The thermal treatment temperature is set to 80~170° C., and preferably 100~160° C. Also, thermal treatment is carried out for 1~30 min, and preferably 3~15 min.

Step 4) is a process of immersing the thermally treated PEDOT:PSS thin film in a solvent such as methanol, ethanol or IPA to remove PTSA remaining on the surface of the thin film. As such, the immersion process is performed at room temperature for 30 sec~10 min, and preferably 3~8 min. Such immersion conditions may vary depending on the size of the sample.

In the method according to the present invention, PTSA remaining on the surface of the thin film after having been used for surface treatment of the thin film may be easily rinsed with methanol, thereby minimizing staining of the surface of the thin film.

Step 5) is a process of drying the PEDOT:PSS thin film, which was taken out of the solvent, to remove the solvent remaining thereon.

A transparent conductive polymer thin film comprising PEDOT:PSS, manufactured by the method as above, is greatly increased in conductivity via surface treatment.

The present invention addresses a transparent electrode including a transparent conductive polymer thin film manufactured by the method as above.

In addition, the present invention addresses an organic solar cell including the transparent conductive polymer thin film as a buffer layer or an electrode layer.

Below is a description of the present invention via the following examples.

Example 1

PH-1000 (available from Heraeus) was subjected to spin coating at 1000 rpm for 30 sec, thus forming a film, which was then dried on a hot plate at 120° C. for 15 min, giving a PEDOT:PSS thin film. Subsequently, a p-toluene sulfonic acid (PTSA) (0.16 M) solution was added dropwise onto the PEDOT:PSS thin film, after which the PEDOT:PSS thin film was thermally treated on a hot plate at 160° C. for 5 min, cooled at room temperature, and then immersed in MeOH for 5 min. Thereafter, the PEDOT:PSS thin film was dried on a hot plate at 160° C. for 5 min.

Example 2

A PEDOT:PSS thin film was formed in the same manner as in Example 1, with the exception that a PTSA (0.1 M) solution was used.

Example 3

A PEDOT:PSS thin film was formed in the same manner as in Example 1, with the exception that the PEDOT:PSS thin film, onto which the PTSA (0.16 M) solution was added dropwise, was thermally treated at 140° C. for 10 min, and dried at 140° C. for 5 min.

Example 4

A PEDOT:PSS thin film was formed in the same manner as in Example 1, with the exception that the PEDOT:PSS thin film, onto which the PTSA (0.16 M) solution was added dropwise, was thermally treated at 100° C. for 15 min, rinsed with MeOH, and dried at 100° C. for 5 min.

Comparative Example 1

A PEDOT:PSS thin film was formed by subjecting a PH-1000 solution to spin coating under conditions of 1000 rpm/30 sec. As such, surface treatment was not performed.

Comparative Example 2

A PEDOT:PSS thin film was formed in the same manner as in Example 1, with the exception that a 0.16 M sulfuric acid aqueous solution was used, instead of the PTSA solution, and rinsing with water was performed.

Comparative Example 3

A PEDOT:PSS thin film was formed in the same manner as in Example 1, with the exception that methanol was used, instead of the PTSA solution.

Comparative Example 4

A PEDOT:PSS thin film was formed in the same manner as in Example 1, with the exception that a 0.16 M sulfuric acid aqueous solution was used, and thermal treatment at 100° C. for 15 min and drying at 100° C. for 5 min were carried out.

In order to evaluate properties of the thin film, the PEDOT:PSS thin films of Examples 1 to 4 and Comparative Examples 1 to 4 were measured for sheet resistance, transmittance and haze.

<Evaluation of Properties of Thin Film>

The sheet resistance of the thin film was measured using a 4-point probe. Also, transmittance and haze were measured.

TABLE 1

| | Surface treatment | Sheet resistance ($\Omega/\square$) | Transmittance | Haze |
|---|---|---|---|---|
| Ex. 1 | 0.16M PTSA solution 160° C./5 min thermal treatment + MeOH rinsing and then 160° C./5 min drying | $1.23 \times 10^2$ | 86.78 | 0.29 |
| Ex. 2 | 0.1M PTSA solution 160° C./5 min thermal treatment + MeOH rinsing and then 160° C./5 min drying | $1.65 \times 10^2$ | 87.59 | 0.23 |
| Ex. 3 | 0.16M PTSA solution 140° C./10 min thermal treatment + MeOH rinsing and then 140° C./5 min drying | $1.18 \times 10^2$ | 86.70 | 0.23 |
| Ex. 4 | 0.16M PTSA solution 100° C./15 min thermal treatment + MeOH rinsing and then 100° C./5 min drying | $3.0 \times 10^2$ | 88.38 | 0.27 |
| C. Ex. 1 | No surface treatment | $3.55 \times 10^5$ | 87.15 | 0.27 |
| C. Ex. 2 | 0.16M Sulfuric acid aqueous solution 160° C./5 min thermal treatment + MeOH rinsing and then 160° C./5 min drying | $2.08 \times 10^2$ | 87.48 | 2.02 |
| C. Ex. 3 | MeOH | $2.70 \times 10^3$ | 87.59 | 0.23 |
| C. Ex. 4 | 0.16M Sulfuric acid aqueous solution 100° C./15 min thermal treatment + MeOH rinsing and then 100° C./5 min drying | $4.39 \times 10^2$ | 88.60 | 0.29 |

<Evaluation of Film Damage>

In order to evaluate whether the film was damaged, the PEDOT:PSS thin films of Example 1 and Comparative Example 2 were observed using an electron microscope.

Figure 2:
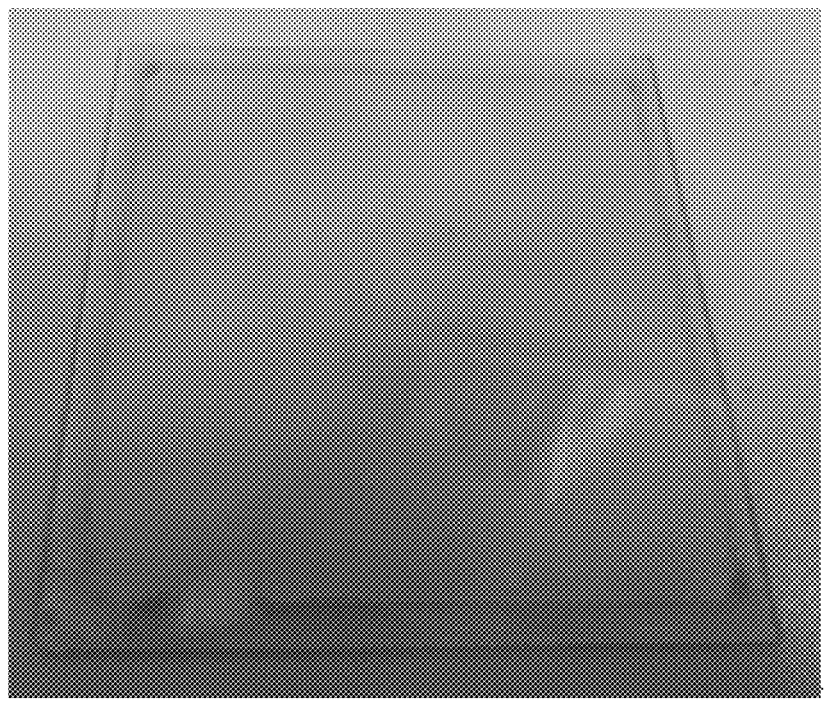
FIG. 2 is an electron microscope image illustrating a PEDOT:PSS thin film manufactured in Example 1.

As illustrated in FIG. 1, the PEDOT:PSS thin film of Comparative Example 2 was severely damaged. Hence, surface treatment using the sulfuric acid aqueous solution may incur excessive film loss. However, as illustrated in FIG. 2, damage to the PEDOT:PSS thin film of Example 1 was not observed. Hence, there is no film damage upon surface treatment with PTSA.

Based on the evaluation results, according to the present invention, a uniform thin film may be formed, and a transparent conductive ink film having high conductivity may also be formed.

What is claimed is:

1. A method of manufacturing a surface-treated transparent conductive polymer film, comprising:
    1) preparing a PEDOT:PSS (Poly(3,4-ethylenedioxythiophene)-poly(styrenesulfonate)) ink composition;
    2) forming a PEDOT:PSS film on a substrate using the ink composition;
    3) applying a p-toluene sulfonic acid solution on the PEDOT:PSS film and then thermally treating the PEDOT:PSS film to yield a thermally treated PEDOT:PSS film;
    4) rinsing the thermally treated PEDOT:PSS film to yield a rinsed PEDOT:PSS film; and
    5) drying the rinsed PEDOT:PSS film.

2. The method of claim 1, wherein the PEDOT:PSS ink composition comprises a PEDOT:PSS aqueous dispersion, a solvent and a surfactant.

3. The method of claim 2, wherein the PEDOT:PSS aqueous dispersion is used in an amount of 10-70 wt % based on a total weight of the ink composition.

4. The method of claim 2, wherein the solvent comprises deionized water; diethyleneglycol butylether or diethyleneglycol ethylether; and propyleneglycol.

5. The method of claim 4, wherein the deionized water is present in an amount of 40-80 wt % based on a total weight of the solvent.

6. The method of claim 4, wherein the diethyleneglycol butylether or diethyleneglycol ethylether is present in an amount of 5-40 wt % based on a total weight of the solvent.

7. The method of claim 4, wherein the propyleneglycol is present in an amount of 5-40 wt % based on a total weight of the solvent.

8. The method of claim 2, wherein the surfactant is present in an amount of 0.01-5 wt % based on a total weight of the ink composition.

9. The method of claim 2, wherein the PEDOT:PSS ink composition further comprises DMSO (Dimethyl sulfoxide) or DMF (Dimethylformamide).

10. The method of claim 9, wherein the DMSO or DMF is present in an amount of 1-5 wt % based on a total weight of the ink composition.

11. The method of claim 9, wherein the PEDOT:PSS ink composition further comprises a polyhydric alcohol compound.

12. The method of claim 11, wherein the polyhydric alcohol compound is present in an amount of 0.5-8 wt % based on a total weight of the ink composition.

13. The method of claim 1, wherein the p-toluene sulfonic acid solution has a concentration of 0.01-0.2 M.

* * * * *